United States Patent
Liu et al.

(10) Patent No.: US 12,278,573 B2
(45) Date of Patent: Apr. 15, 2025

(54) FRICTION NANO POWER GENERATION SYNAPTIC TRANSISTOR

(71) Applicant: XI'AN JIAOTONG-LIVERPOOL UNIVERSITY, Jiangsu (CN)

(72) Inventors: Qihan Liu, Jiangsu (CN); Chun Zhao, Jiangsu (CN); Cezhou Zhao, Jiangsu (CN); Yina Liu, Jiangsu (CN); Li Yang, Jiangsu (CN)

(73) Assignee: XI'AN JIAOTONG-LIVERPOOL UNIVERSITY, Suzhou (CN)

( * ) Notice: Subject to any disclaimer, the term of this patent is extended or adjusted under 35 U.S.C. 154(b) by 317 days.

(21) Appl. No.: 18/042,283

(22) PCT Filed: Dec. 8, 2021

(86) PCT No.: PCT/CN2021/136366
§ 371 (c)(1),
(2) Date: Feb. 20, 2023

(87) PCT Pub. No.: WO2022/121931
PCT Pub. Date: Jun. 16, 2022

(65) Prior Publication Data
US 2023/0327579 A1     Oct. 12, 2023

(30) Foreign Application Priority Data

Dec. 8, 2020  (CN) .......................... 202011421752.7

(51) Int. Cl.
*H02N 1/04*     (2006.01)
*G06N 3/063*    (2023.01)
(Continued)

(52) U.S. Cl.
CPC ............... *H02N 1/04* (2013.01); *G06N 3/063* (2013.01); *H10D 30/023* (2025.01);
(Continued)

(58) Field of Classification Search
CPC .......... H02N 1/04; H10N 30/30; H06N 3/063; H10D 30/023; H10D 30/6891
(Continued)

(56) References Cited

U.S. PATENT DOCUMENTS

2008/0275832 A1   11/2008  McDaid
2010/0283028 A1   11/2010  Brubaker
(Continued)

FOREIGN PATENT DOCUMENTS

CN     103915464 A  *  7/2014  ............. H01L 27/24
CN     104251751 A  *  12/2014  ............... G01L 1/00
(Continued)

OTHER PUBLICATIONS

Translation of CN 106910773 A (Year: 2017).*
(Continued)

*Primary Examiner* — Michael Andrews
*Assistant Examiner* — Daniel K Schlak

(57) ABSTRACT

Provided is a friction nano power generation synaptic transistor. The friction nano power generation synaptic transistor includes a friction nano generator, a synaptic transistor, a substrate, an electrode layer formed on the substrate, a shared intermediate layer formed on the electrode layer; a synaptic transistor active layer, a source electrode, and a drain electrode which are formed on the shared intermediate layer; and a positive friction layer and a negative friction layer formed on the shared intermediate layer, where the shared intermediate layer is used as a dielectric layer of the synaptic transistor and an intermediate layer of the friction nano generator.

7 Claims, 3 Drawing Sheets

(51) Int. Cl.

| | | |
|---|---|---|
| *H10D 30/01* | (2025.01) | |
| *H10D 30/67* | (2025.01) | |
| *H10D 30/68* | (2025.01) | |
| *H10D 48/50* | (2025.01) | |
| *H10N 30/30* | (2023.01) | |
| H10D 62/80 | (2025.01) | |

(52) U.S. Cl.
CPC ............ *H10D 48/50* (2025.01); *H10N 30/30* (2023.02); *H10D 30/67* (2025.01); *H10D 30/6891* (2025.01); *H10D 62/80* (2025.01)

(58) Field of Classification Search
USPC .......................................................... 310/310
See application file for complete search history.

(56) References Cited

U.S. PATENT DOCUMENTS

| | | | | |
|---|---|---|---|---|
| 2016/0343877 | A1* | 11/2016 | Shi | H10D 30/6757 |
| 2017/0054067 | A1* | 2/2017 | Zhang | H01L 23/535 |
| 2017/0322094 | A1* | 11/2017 | Kim | G01L 1/005 |
| 2017/0331396 | A1* | 11/2017 | Byun | H02N 1/04 |
| 2020/0221969 | A1* | 7/2020 | Ram | H10F 30/00 |
| 2020/0303534 | A1* | 9/2020 | Ram | H10D 30/675 |
| 2021/0226257 | A1* | 7/2021 | Wang | H01M 50/284 |
| 2023/0271320 | A1* | 8/2023 | Dayeh | H10D 48/50 |
| | | | | 700/260 |

FOREIGN PATENT DOCUMENTS

| | | | | |
|---|---|---|---|---|
| CN | 105845825 A * | 8/2016 | ........... | H01L 27/283 |
| CN | 106612079 A * | 5/2017 | ........... | H01L 29/786 |
| CN | 106847817 A | 6/2017 | | |
| CN | 106910773 A * | 6/2017 | ............. | H01L 29/78 |
| CN | 107144704 A | 9/2017 | | |
| CN | 109830598 A | 5/2019 | | |
| CN | 111739935 A | 10/2020 | | |
| CN | 112201696 A | 1/2021 | | |
| KR | 20190136402 A | 12/2019 | | |
| WO | WO2009/087109 | 7/2009 | | |
| WO | WO-2019082107 A1 * | 5/2019 | ............... | H02N 1/04 |

OTHER PUBLICATIONS

Translation of CN 106612079 A (Year: 2017).*
Translation of CN 104251751 A (Year: 2014).*
Translation of CN 105845825 A (Year: 2016).*
Translation of CN 103915464 A (Year: 2014).*
Chi Zhang et al., Contact Electrification Field-Effect Transistor, 10.1021/nn5039806 (2014).
ISR for PCT/CN2021/136366 (2022).
First Office Action for CN202011421752.7.
Zhang, C., Oxide Synaptic Transistors Coupled With Triboelectric Nanogenerators for Bio-Inspired Tactile Sensing Application, IEEE Electron Device Letters, vol. 41, No. 4, Apr. 2020.
Extended European Search Report for 21902696.6 (Jun. 24, 2024) (5 pages).
Yang et al., Mechamoplastic Tribotrooic Floating-Gate Neyromorphic Transistor, Advanced Functional Materials 2020 (10 pages).

* cited by examiner

FRICTION NANO POWER GENERATION SYNAPTIC TRANSISTOR

CROSS-REFERENCE TO RELATED APPLICATIONS

This is a National Stage Application, filed under 35 U.S.C. 371, of International Patent Application No. PCT/CN2021/136366, filed on Dec. 8, 2021, which claims priority to Chinese Patent Application No. 202011421752.7, filed with the China National Intellectual Property Administration (CNIPA) on Dec. 8, 2020, the disclosures of which are incorporated herein by reference in their entireties.

TECHNICAL FIELD

The present application relates to a friction nano power generation synaptic transistor, which belongs to the technical field of semiconductor devices.

BACKGROUND

The demands of big data and efficient man-machine interaction brought by the intelligent era put forward higher requirements for processing and storage of complex information. Compared with the low power and small size of a human brain, a computer system has obvious defects, and in recent years, a neural network calculation system developed by simulating the information processing manner of the human brain provides a potential approach to efficient computation. Most neural network systems apply the complementary metal oxide semiconductor technology, although a calculation function of a neural network can be achieved in the case of combining code algorithms, the efficiency of the neural network system is still far lower than that of the human brain. The root reason for this is that the neural network system is stuck by the limitation of the von Neumann framework, therefore, an effective method for solving the problem is that the low-power and high-efficiency computation as the human brain is achieved by simulating the working principle of neurons and synapses in the human brain based on a single device. Thus, simulating the structure and the working mechanism of a biological synapse and preparing a bionic artificial synaptic device with the biological synaptic function are the key points for achieving a neural network with low power and high efficiency. Recently, various applications based on bionic artificial synaptic devices emerge from many research institutions at home and abroad, and a bionic synaptic transistor based on a thin film transistor structure shows characteristics such as being simple in structure, low in power, and complete in synaptic characteristics, which is widely concerned. Meanwhile, the bionic synaptic transistor also shows certain application potential in a bionic skin and a bionic sensor, and the bionic synaptic transistor forms a system with a sensor or a friction power generation device through a circuit and a device such as a rectifier bridge, so as to achieve the bionic functions of acquisition of external stimulation, signal transmission, information storage, and the like. As an interaction of a neural network-like system and an external information acquisition port, the bionic synaptic transistor shows an extremely high application value. However, research in recent years implements the integration of the bionic synaptic transistor with a stimulation acquisition end through an extra complex circuit, and an additional power supply is further required, which does not facilitate the application to a flexible electronic device, a wearable device, a bionic skin, and so on.

SUMMARY

The present application provides a friction nano power generation synaptic transistor, which does not need an extra power supply, is light and flexible, and is simple in structure.

A friction nano power generation synaptic transistor is provided. The friction nano power generation synaptic transistor includes a friction nano generator, a synaptic transistor, a substrate, an electrode layer formed on the substrate, a shared intermediate layer formed on the electrode layer, a synaptic transistor active layer, a source electrode, and a drain electrode which are formed on the shared intermediate layer, and a positive friction layer and a negative friction layer which are formed on the shared intermediate layer, where the shared intermediate layer is used as a dielectric layer of the synaptic transistor and also as an intermediate layer of the friction nano generator, and the electrode layer is used as an output electrode of the friction nano generator and a gate electrode of the synaptic transistor. In a case where the negative friction layer is rubbed by using a positive friction material or the positive friction layer is rubbed by using a negative friction material, the shared intermediate layer generates a pulse voltage, and charges in the shared intermediate layer are transferred to change an electrical conductivity of the synaptic transistor active layer, and an excitatory postsynaptic current is generated between the source electrode and the drain electrode.

DETAILED DESCRIPTION

The technical schemes of the present application will now be described in conjunction with the accompanying drawings below, and the described embodiments are some, but not all, embodiments of the present application.

Further, technical features related to different implementations of the present application described below may be combined with each other as long as they do not conflict with each other.

Figure 1:
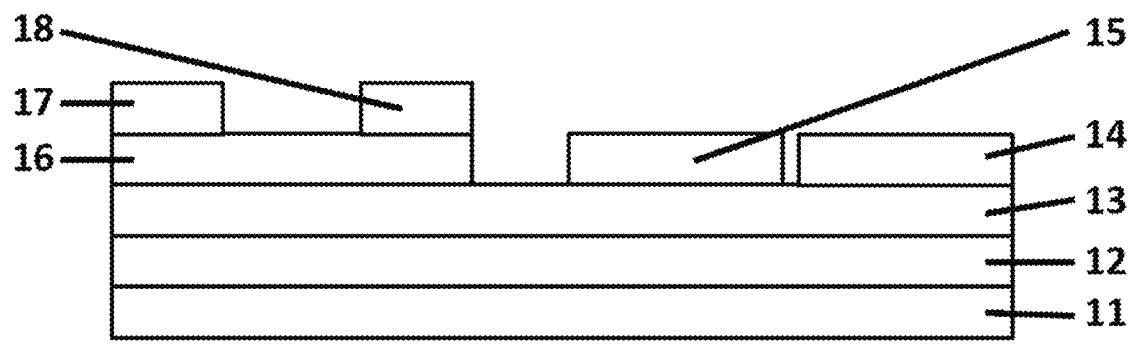
FIG. 1 is a schematic structural diagram of a friction nano power generation synaptic transistor shown in the present application.

Referring to FIG. 1, a self-driven friction nano power generation synaptic transistor according to an embodiment of the present application includes a friction nano generator and a synaptic transistor. The self-driven friction nano power generation synaptic transistor further includes a substrate 11, an electrode layer 12 formed on the substrate 11, a shared intermediate layer 13 formed on the electrode layer 12, a synaptic transistor active layer 16, a source electrode 17 and a drain electrode 18 formed on the shared intermediate layer 13, and a positive friction layer 14 and a negative friction layer 15 formed on the shared intermediate layer 13. The shared intermediate layer 13 is used as a dielectric layer of the synaptic transistor and an intermediate layer of the friction nano generator, the electrode layer 12 is used as an output electrode of the friction nano generator and a gate electrode of the synaptic transistor. In a case where the positive friction layer 14 or the negative friction layer 15 is rubbed, the shared intermediate layer 13 generates a pulse voltage, electrical charges in the shared intermediate layer 13 are transferred to change the electrical conductivity of the synaptic transistor active layer 16, and an excitatory post-synaptic current is generated between the source electrode 17 and the drain electrode 18.

The material of the shared intermediate layer 13 is a high dielectric material, and the high dielectric material is a high dielectric material with the synaptic effect or a high dielectric material with ferroelectric polarization characteristics. The high dielectric material is one or a combination of two or more of gallium oxide, hafnium oxide, aluminum oxide, tantalum oxide, iridium oxide, zirconium oxide, lanthanum oxide, lithium oxide or scandium oxide. The high dielectric material may also be other materials, which is not listed here. The thickness of the shared intermediate layer 13 is in the range of 20 nm to 80 nm. In this embodiment, the shared intermediate layer 13 is an aluminum oxide high dielectric material.

The substrate 11 is any one of glass, silica, polyimide, polyethylene terephthalate, or polyethylene naphthalate. The substrate 11 may be a rigid substrate or a flexible substrate, and in this embodiment, the substrate 11 is a single crystal silicon, and silicon dioxide with the thickness of 20 nm to 200 nm is formed on the surface of the single crystal silicon. The material of the substrate 11 is not limited here and may also be other materials, which are not listed here, and an appropriate substrate 11 may be selected according to actual needs.

The electrode layer 12, the source electrode 17, and the drain electrode 18 are made of one or a combination of two or more of indium zinc oxide, indium tin oxide, zinc aluminum oxide, titanium nitride, gold, silver, copper, or aluminum. The thickness of the electrode layer 12 is in a range of 200 nm to 400 nm, and the thickness of the source electrode 17 and the thickness of the drain electrode 18 are each in a range of 200 nm to 400 nm. Materials of the electrode layer 12, the source electrode 17 and the drain electrode 18 are not limited here, and may also be other materials, which are not listed here. In this embodiment, the electrode layer 12 is indium tin oxide (ITO), and the source electrode 17 and the drain electrode 18 are made of aluminum. Positions of the source electrode 17 and the drain electrode 18 are not limited herein, and the distance between the source electrode 17 and the drain electrode 18 may be selected according to practice, which is not repeated herein.

The material of the synaptic transistor active layer 16 is one of an organic semiconductor material or an inorganic semiconductor material. The material of the synaptic transistor active layer 16 is not listed here and may be selected according to actual needs, and a thickness range of the synaptic transistor active layer 16 is set according to actual needs, for example, the thickness range of the synaptic transistor active layer 16 is 5 nm to 100 nm. In this embodiment, the synaptic transistor active layer 16 is prepared from an indium oxide semiconductor.

The positive friction layer 14 is prepared from a material easier to lose electrons. The negative friction layer 15 is prepared from a material easier to obtain electrons. The materials of the positive friction layer 14 and the negative friction layer 15 are not listed here. The thickness of the positive friction layer 14 and the thickness of the negative friction layer 15 are each in a range of 0.1 mm to 1 mm, which may be set according to actual needs without limitation. In the embodiment, the positive friction layer 14 is a copper foil, and the negative friction layer 15 is a polytetrafluoroethylene film.

A method for preparing the self-driven friction nano power generation synaptic transistor described above is described below.

In step one, a substrate is washed and hydrophilically treated.

A single crystal silicon having silicon dioxide is provided as the substrate, where the silicon dioxide is provided on the surface of the single crystal silicon and has the thickness of 20 nm to 200 nm; the substrate is completely immersed into an acetone solution, and ultrasonic washing is performed for 10 min to 30 min; the substrate is transferred and completely immersed into an isopropanol solution, and the ultrasonic washing is performed for 10 min to 30 min; then the substrate is completely immersed into an ethanol solution, and the ultrasonic washing is performed for 10 min to 30 min; finally, the substrate is washed by using deionized water and blown dry by using nitrogen, whereby the washing of the substrate is finished.

The washed substrate is placed into an ultraviolet ozone washing machine and is subjected to surface ozone washing for 10 min to 30 min to obtain the substrate with a hydrophilic surface.

In step two, an electrode layer is prepared.

ITO with the thickness of 200 nm to 400 nm is prepared on the surface of the substrate by using a magnetron sputtering process to obtain the electrode layer. If the electrode layer with a pattern needs to be prepared, a mask with the corresponding pattern may be disposed on the substrate in the preparation process.

In step three, a shared intermediate layer is prepared.

Surface ozone washing is first performed on the substrate with the ITO in the ultraviolet ozone washing machine for 10 min to 30 min; an aluminum oxide precursor solution is prepared, in an embodiment, 0.23 g to 2.3 g of aluminum nitrate nonahydrate and 0.094 g to 0.94 g of urea are dissolved in 5 ml to 50 ml of ethanol and subjected to magnetically stirring for 5 min to 20 min, after filtering through a polytetrafluoroethylene filter with the pore diameter of 0.22 μm the aluminum oxide precursor solution is dropped on the surface of the ITO, and spin coating is performed for 10 s to 60 s at 2000 rpm to 6000 rpm; and a spin-coated sample with the aluminum oxide precursor solution is placed on a heating plate and subjected to annealing treatment at 250° C. to 350° C. to obtain an aluminum oxide film with the thickness of 20 nm to 80 nm.

If the shared intermediate layer with a pattern needs to be prepared, a mask with the corresponding pattern may be disposed on the surface of the ITO in an ozone washing process to have selective washing, thus the aluminum oxide film with the pattern may be obtained.

In step four, a synaptic transistor active layer is prepared.

An indium oxide semiconductor precursor solution is prepared, in an embodiment, 0.22 g to 2.2 g of indium nitrate hydrate is dissolved in 5 ml of deionized water to be uniformly stirred; the indium oxide semiconductor precursor solution is sprayed on the aluminum oxide film through an ink-jet printing; and annealing treatment is performed at 250° C. to 350° C. to obtain the synaptic transistor active layer with the thickness of 5 nm to 100 nm.

If the synaptic transistor active layer with a pattern needs to be prepared, it may be achieved through ink-jet printing, which is not repeated here.

In step five, a source electrode and a drain electrode are prepared.

A mask is covered on the synaptic transistor active layer first, the aluminum oxide film is subjected to the electron beam evaporation with a patterned aluminum with the thickness of 200 nm to 400 nm to be used as the source electrode and the drain electrode. The source electrode and the drain electrode may also have a pattern, and the pattern may be selected according to practice.

In step six, a positive friction layer is prepared.

The positive friction layer is obtained by covering a single-sided adhesive copper foil having the thickness of 0.1 mm to 1 mm on a designated region on the aluminum oxide film.

In step seven, a negative friction layer is prepared.

The negative friction layer is obtained by covering a single-sided adhesive polytetrafluoroethylene film having the thickness of 0.1 mm to 1 mm on a designated region on the aluminum oxide film.

Figure 2:
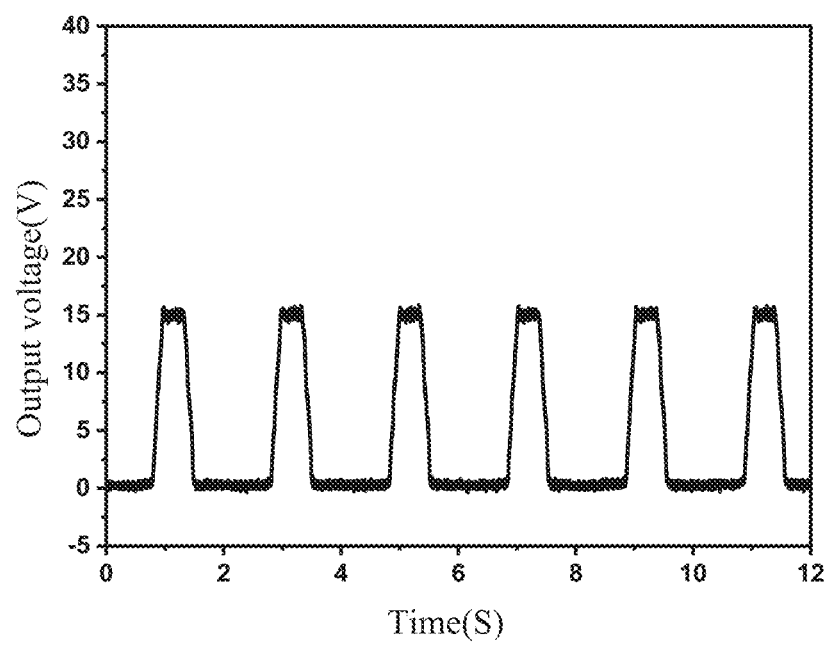
FIG. 2 is an open-circuit voltage diagram of a friction nano power generation synaptic transistor without a shared intermediate layer shown in FIG. 1.
Figure 3:
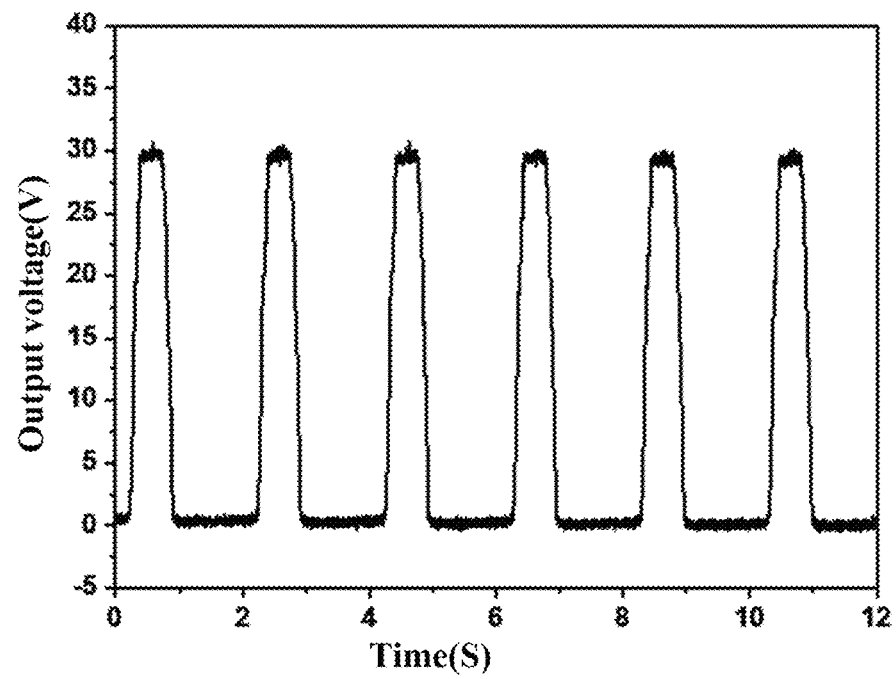
FIG. 3 is an open-circuit voltage diagram of a nano generator end of a friction nano power generation synaptic transistor shown in FIG. 1 implemented with an aluminum oxide high dielectric material as a shared intermediate layer.

In the present application, the synaptic transistor and the friction nano generator are integrated by sharing the dielectric layer of the synaptic transistor with the intermediate layer of the friction nano generator, the preparation process flow and cost are reduced, and the output of the friction nano generator is improved. Referring to FIGS. 2 and 3, FIG. 2 is an open-circuit voltage diagram of a self-driven friction nano power generation synaptic transistor without a shared intermediate layer, and FIG. 2 is used as a blank control with the peak value of voltage about 15 volts. FIG. 3 is an open-circuit voltage diagram of a self-driven friction nano power generation synaptic transistor implemented by using an aluminum oxide high dielectric material as the shared intermediate layer, in which the peak value of voltage is about 30 volts, compared with the case of no shared intermediate layer, the aluminum oxide high dielectric material using as the shared intermediate layer obviously improves the open-circuit voltage, and generates about 100% open-circuit voltage amplification, namely, improves the output of the friction nano generator.

Figure 4:
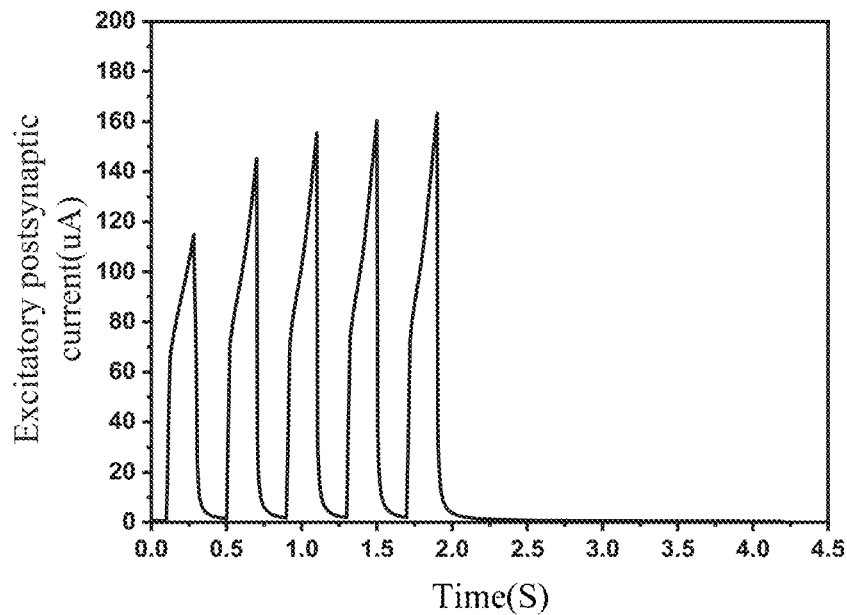
FIG. 4 is a diagram of an excitatory postsynaptic current of a friction nano power generation synaptic transistor shown in FIG. 1 with an enhanced characteristic.
Figure 5:
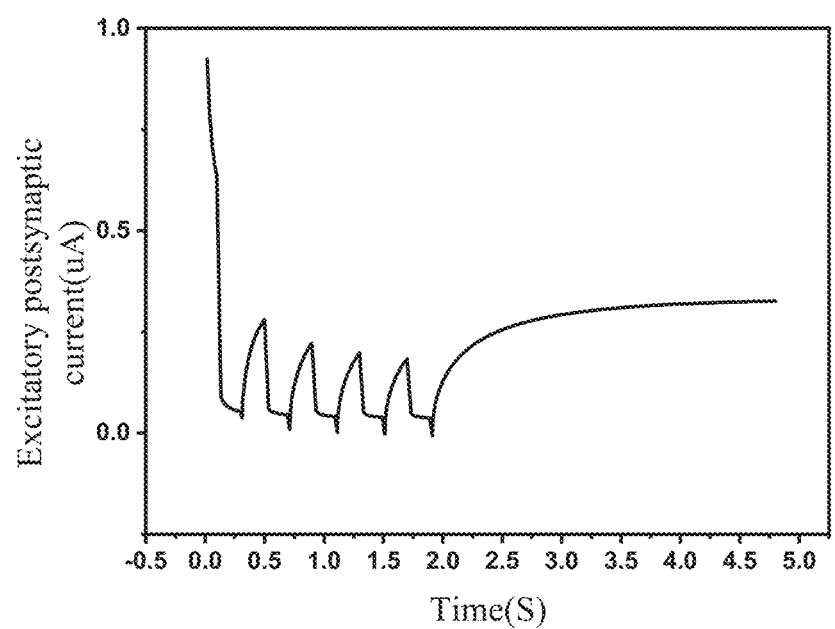
FIG. 5 is a diagram of an excitatory postsynaptic current of a friction nano power generation synaptic transistor shown in FIG. 1 with an attenuation characteristic.

Positive charges or negative charges are collected through the friction nano generator, whereby the enhanced effect or inhibited effect of the excitatory postsynaptic current of the synaptic transistor is achieved, and the integration effect of the self-driven friction nano power generation synaptic transistor is achieved. Referring to FIG. 4, the self-driven friction nano power generation synaptic transistor obtained in this embodiment has enhanced characteristics, a positive friction material is used to rub the negative friction layer, and a positive stimulation pulse signal generated by induction of the negative friction layer acts on the gate electrode of the synaptic transistor, so that the enhanced effect of the excitatory postsynaptic current as shown in FIG. 4 is generated. Referring to FIG. 5, the self-driven friction nano power generation synaptic transistor obtained in this embodiment has attenuation characteristics, a negative friction material is used to rub the positive friction layer, and a negative stimulation pulse signal generated by induction of the positive friction layer acts on the gate electrode of the synaptic transistor, so that the inhibition effect of the excitatory postsynaptic current as shown in FIG. 5 is generated. The synaptic current after excitatory and the excitatory postsynaptic current are identical and are both words of translation, which are not distinguished here.

The friction nano generator has the advantages of low cost, high efficiency, no pollution and the like, and also has a great advantage in mechanical motion energy collection. Therefore, the application of the friction nano generator in a self-driven flexible electronic device and a smart wearable device has received more and more attention. In this application, the friction nano generator and a bionic synaptic device are integrated to obtain the self-driven friction nano power generation synaptic transistor which may not only respond to external stimulation and collect energy so as to generate an electric signal, but also achieve the bionic synaptic function driven by the generated electric signal. Due to the introduction of the structure of the friction nano generator, the energy collection and the response to the external stimulation are achieved, so that the synaptic transistor may be driven and the excitatory postsynaptic current may be generated without additional power supply, whereby bionic functions such as synaptic inhibition and enhancement are achieved.

In conclusion, (1) the self-driven friction nano power generation synaptic transistor obtained by integrating the friction nano generator and the bionic synaptic transistor is light, flexible, and simple in structure, and can achieve the function of the bionic synaptic transistor in a self-driven manner.

(2) Charge transfer is generated without an external power supply to drive the synaptic transistor and generate the excitatory postsynaptic current.

(3) The shared intermediate layer uses the high dielectric material, so that an output voltage of the friction nano generator is improved and the synaptic function of the synaptic transistor can be achieved.

Any combination of technical features of the above embodiments may be made, and for the sake of brevity, all possible combinations of the technical features of the above embodiments are not described, however, they should be considered to be within the scope of this Description as long as there is no contradiction between the combinations of the technical features.

What is claimed is:

1. A friction nano power generation synaptic transistor, comprising a friction nano generator, a synaptic transistor, a substrate, an electrode layer formed on the substrate, a shared intermediate layer formed on the electrode layer, a synaptic transistor active layer, a source electrode and a drain electrode which are formed on the shared intermediate layer, and a positive friction layer and a negative friction layer formed on the shared intermediate layer; wherein the shared intermediate layer is used as a dielectric layer of the synaptic transistor and an intermediate layer of the friction nano generator, and the electrode layer is used as an output electrode of the friction nano generator and a gate electrode of the synaptic transistor; in a case where the negative friction layer is rubbed by using a positive friction material or the positive friction layer is rubbed by using a negative friction material, the shared intermediate layer generates a pulse voltage, and charges in the shared intermediate layer are transferred to change an electrical conductivity of the synaptic transistor active layer, and an excitatory postsynaptic current is generated between the source electrode and the drain electrode.

2. The friction nano power generation synaptic transistor of claim 1, wherein a material of the shared intermediate layer is a high dielectric material.

3. The friction nano power generation synaptic transistor of claim 2, wherein the high dielectric material is a high dielectric material with synaptic effect or a high dielectric material with ferroelectric polarization characteristics.

4. The friction nano power generation synaptic transistor of claim 2, wherein the high dielectric material is one or a combination of two or more of gallium oxide, hafnium oxide, aluminum oxide, tantalum oxide, iridium oxide, zirconium oxide, lanthanum oxide, lithium oxide or scandium oxide.

5. The friction nano power generation synaptic transistor of claim 1, wherein the substrate is one of glass, silica, polyimide, polyethylene terephthalate, or polyethylene naphthalate.

6. The friction nano power generation synaptic transistor of claim 1, wherein each of the electrode layer, the source electrode and the drain electrode is made of one or a combination of two or more of indium zinc oxide, indium tin oxide, zinc aluminum oxide, titanium nitride, gold, silver, copper, or aluminum.

7. The friction nano power generation synaptic transistor of claim 1, wherein a material of the synaptic transistor active layer is one of an organic semiconductor material or an inorganic semiconductor material.

\* \* \* \* \*